United States Patent [19]

Horneff

[11] 3,743,958

[45] July 3, 1973

[54] CIRCUIT FOR COMPENSATING FOR LINEARITY DEFECTS IN AMPLIFIERS

[75] Inventor: Hans Horneff, Darmstadt, Germany

[73] Assignee: Fernseh GmbH Darmstadt, Darmstadt, Germany

[22] Filed: Dec. 7, 1971

[21] Appl. No.: 205,671

[30] Foreign Application Priority Data

Dec. 9, 1970 Germany .................. P 20 60 458.4

[52] U.S. Cl. ..................... 330/149, 330/35, 330/145

[51] Int. Cl. ............................................ H03f 1/26

[58] Field of Search ...................... 330/149, 35, 144, 330/145; 328/142–145, 162; 178/DIG. 16

[56] References Cited

UNITED STATES PATENTS

| | | | |
|---|---|---|---|
| 2,692,333 | 10/1954 | Holmes | 178/DIG. 16 |
| 3,588,338 | 6/1971 | Dischert et al. | 178/DIG. 16 |

*Primary Examiner*—Roy Lake
*Assistant Examiner*—James B. Mullins
*Attorney*—Carroll B. Quaintance et al.

[57] ABSTRACT

A voltage divider is placed in series with an amplifier needing compensation. A resistor and a field-effect transistor form the voltage divider. A controlled amount of distorted signal is applied to the field-effect transistor to compensate for distortion in the amplifier.

4 Claims, 6 Drawing Figures

CIRCUIT FOR COMPENSATING FOR LINEARITY DEFECTS IN AMPLIFIERS

BACKGROUND OF THE INVENTION

1. Field of the Invention

The invention relates to a circuit arrangement for the compensation of linearity errors in amplifiers, wherein the drain-source path of a field effect transistor forms the lower portion of a voltage divider, a resistor forms the upper portion, and an input voltage is delivered to one end of the upper portion, whereby an output voltage can be taken off from the junction point between the upper and lower portions.

2. Description of the Prior Art

Particularly stringent demands are made upon the linearity of the transfer characteristic of video amplifiers. However, in general this characteristic is only approximately linear and exhibits a certain curvature to the extent that, if the voltage to be transmitted shows an increasing deviation from the center point of the control characteristic curve, the differential amplification decreases.

SUMMARY OF THE INVENTION

A purpose of the present invention is to provide a circuit arrangement which can be connected in front of or following such amplifiers and which removes, as far as possible, the above described defect.

The invention is characterized by the feature that the input voltage is delivered through a non-linear transmission member to the control electrode of the field-effect transistor.

DESCRIPTION OF THE PREFERRED EMBODIMENT

Figure 1:
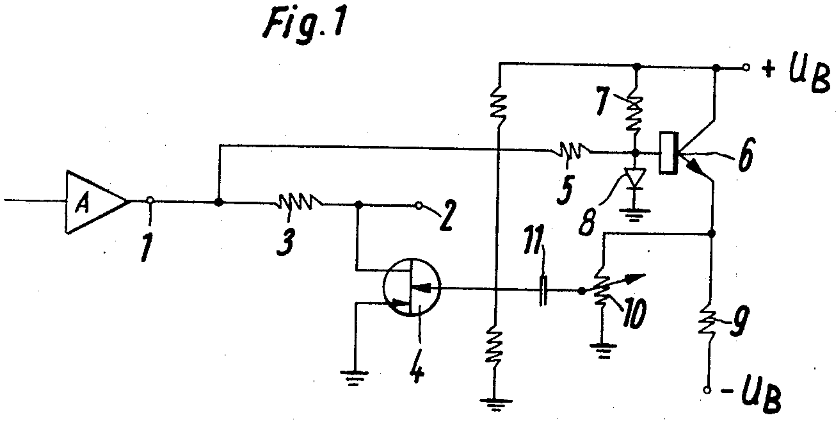
FIG. 1 illustrates a working embodiment of the invention.

In the circuit arrangement according to FIG. 1, input signals are applied at a terminal 1, these signals having passed through an amplifier A and consequently having been affected by linearity errors. Alternatively, the amplifier can be connected to amplify the signal (in a manner not illustrated) from the output of an amplifier. Between the input terminal 1 and an output terminal 2, there is a voltage divider consisting of a resistance 3 and a field-effect transistor 4. The input voltage is furthermore delivered through a resistance 5 to the base of a transistor 6. The base of this transistor receives a bias voltage through a resistance 7, which, like the collector of the transistor, is connected to one pole ($+U_B$) of the operating voltage source. A diode 8 distorts the amplitude of the input signals at the emitter of the transistor 6, which is connected through a resistance 9 to the negative pole ($-U_B$) of the operating voltage source. At the junction of the resistance 9 and the negative pole, the distorted output signals can be picked off and delivered through an adjustable potentiometer 10 and a coupling condenser 11 to the gate electrode of the field-effect transistor 4.

Figure 2A:
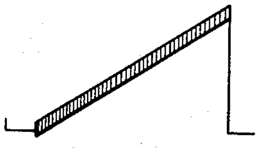
FIGS. 2A through 2E illustrate voltage-time diagrams for explaining this working embodiment.
Figure 2B:
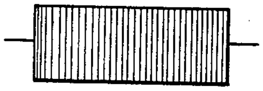
Figure 2C:
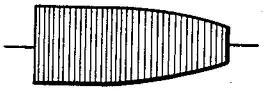
Figure 2D:
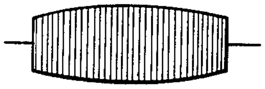
Figure 2E:
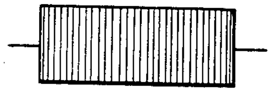

FIGS. 2A through 2E illustrate voltage-time diagrams which result from the conventional method of measuring linearity adopted in the television art. As shown, the line frequency saw-tooth voltage of FIG. 2A has superimposed upon it an alternating voltage of constant amplitude and is delivered to the amplifier which is under test. After this test signal has passed through the amplifier, a band pass filter is employed to pass only the alternating voltage to one pair of plates of an oscillograph. The frequency of this alternating voltage is usually in the range of 4 MHz. In the case of a test circuit having an ideal transfer characteristic, the oscillograph screen image has the form indicated in FIG. 2B. Because of the high frequency, the individual oscillations of the alternating voltage are no longer resolved, and a band appears which is of uniform height over the width of one television line. FIG. 2C represents the output of an amplifier in which the control characteristic curve has been flattened in one direction. If an adjustable undistorted portion of the input voltage is delivered to the control electrode of the field-effect transistor, then it is possible to reduce the errors shown in FIG. 2C, but the deviations shown in FIG. 2D persist. Only by means of a distortion, for example that obtained by diode 8, is it possible to obtain complete compensation of the error, as illustrated in FIG. 2E.

The extent of compensation can be chosen as desired according to the adjustment of the potentiometer 10 in the circuit arrangement according to FIG. 1.

I claim:

1. A circuit arrangement for compensating a signal for linearity errors occurring in an amplifier, comprising:

A. a resistance having first and second resistance terminals between which a current may pass through the resistance,
B. a field-effect transistor having a drain-source path and a gate,
C. means for connecting said second resistance terminal and one end of said drain-source path at a junction to form a voltage divider which comprises the resistance and the drain-source path,
D. means for connecting said amplifier in a path of said signal in series with the resistance and for applying an amplifier signal to the first resistance terminal,
E. means for deriving a distorted version of a signal value from said first resistance terminal, and
F. means for supplying a portion of said distorted version to said gate to control said voltage divider, thereby compensating in said voltage divider for errors occurring in said amplifier.

2. A circuit arrangement according to claim 1 wherein said means for supplying comprises an adjustable attenuating member for controlling the degree of compensation in said voltage divider.

3. A circuit arrangement according to claim 1 wherein said means for deriving a distorted version of the signal comprises a non-linear transmission member.

4. A circuit arrangement according to claim 3 wherein said non-linear transmission member comprises a diode.

* * * * *